(12) United States Patent
Choi

(10) Patent No.: US 8,703,538 B2
(45) Date of Patent: Apr. 22, 2014

(54) INTEGRATED CIRCUIT PACKAGING SYSTEM WITH EXTERNAL WIRE CONNECTION AND METHOD OF MANUFACTURE THEREOF

(75) Inventor: DaeSik Choi, Seoul (KR)

(73) Assignee: Stats Chippac Ltd., Singapore (SG)

( * ) Notice: Subject to any disclaimer, the term of this patent is extended or adjusted under 35 U.S.C. 154(b) by 95 days.

(21) Appl. No.: 13/244,262

(22) Filed: Sep. 23, 2011

(65) Prior Publication Data

US 2013/0075916 A1 Mar. 28, 2013

(51) Int. Cl.
*H01L 21/56* (2006.01)
*H01L 23/28* (2006.01)

(52) U.S. Cl.
USPC .......................................... 438/107; 257/773

(58) Field of Classification Search
USPC .................... 257/773–776, E23.01, E23.011, 257/E21.577, E21.578, 686, 698, 690, 693, 257/787, 788, E23.116, E21.502, E21.506; 438/637–640, 668, 672, 107, 617
See application file for complete search history.

(56) References Cited

U.S. PATENT DOCUMENTS

| | | | | |
|---|---|---|---|---|
| 5,989,939 A | * | 11/1999 | Fjelstad | 438/117 |
| 6,107,682 A | * | 8/2000 | Fjelstad | 257/693 |
| 6,218,728 B1 | * | 4/2001 | Kimura | 257/693 |
| 6,268,662 B1 | * | 7/2001 | Test et al. | 257/784 |
| 7,242,081 B1 | * | 7/2007 | Lee | 257/686 |
| 7,572,679 B2 | * | 8/2009 | Gupta et al. | 438/124 |
| 7,671,459 B2 | | 3/2010 | Corisis et al. | |
| 7,777,351 B1 | * | 8/2010 | Berry et al. | 257/778 |
| 8,026,589 B1 | * | 9/2011 | Kim et al. | 257/690 |
| 2003/0234451 A1 | * | 12/2003 | Razon | 257/773 |
| 2009/0283900 A1 | * | 11/2009 | Yamada | 257/698 |

\* cited by examiner

*Primary Examiner* — Long K Tran
*Assistant Examiner* — Jordan Klein
(74) *Attorney, Agent, or Firm* — Ishimaru & Associates LLP

(57) ABSTRACT

A method of manufacture of an integrated circuit packaging system includes: providing a package carrier; mounting an integrated circuit to the package carrier; forming an external wire on the package carrier and adjacent to the integrated circuit; forming an encapsulation on the package carrier over the external wire; and forming a hole in the encapsulation with the external wire and a portion of the package carrier exposed from the encapsulation.

10 Claims, 7 Drawing Sheets

INTEGRATED CIRCUIT PACKAGING SYSTEM WITH EXTERNAL WIRE CONNECTION AND METHOD OF MANUFACTURE THEREOF

TECHNICAL FIELD

The present invention relates generally to an integrated circuit packaging system, and more particularly to a system for stacking packages.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit packaging system improved yield, low profile, and improved reliability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including; providing a package carrier, mounting an integrated circuit to the package carrier, forming an external wire on the package carrier and adjacent to the integrated circuit, forming an encapsulation on the package carrier over the external wire and forming a hole in the encapsulation with the external wire and a portion of the package carrier exposed from the encapsulation.

The present invention provides an integrated circuit packaging system including; a package carrier, an integrated circuit on the package carrier, an external wire on the package carrier and adjacent to the integrated circuit and an encapsulation on the package carrier, the encapsulation having a hole exposing the external wire and a portion of the package carrier.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
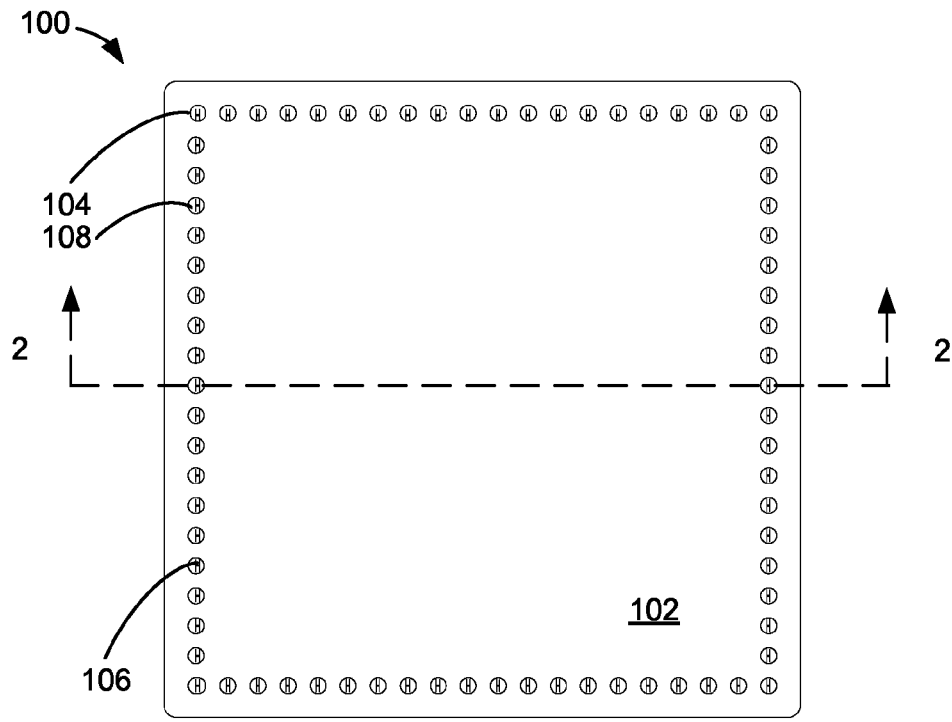
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements or components with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can have an encapsulation 102 with holes 104. The encapsulation 102 is defined as a cover to protect the contents within the integrated circuit packaging system 100 from the environment and provides a hermetic seal.

The holes 104 can be along periphery of the encapsulation 102. Each of the holes 104 exposes an external wire 106 and a package carrier 108. The external wire 106 is defined as an electrical connection structure made from a wire or a wiring technology and for the purpose of providing external connection to the external environment. The term "external" refers to outside of the integrated circuit packaging system 100.

The package carrier 108 is defined as a support structure providing a mounting structure to the internal contents of the integrated circuit packaging system 100 as well as conductive paths within, to, and out of the integrated circuit packaging system 100. As examples, the package carrier 108 can be a laminated substrate, a ceramic substrate, or a leadframe type carrier.

For illustrative purposes, the holes 104 are shown as single row evenly distributed adjacent to the perimeter of the integrated circuit packaging system 100, although it is understood that the configuration of the holes 104 can be different. For example, the holes 104 can be in multiple rows, not along each side of the perimeter, or the sizes can differ between the holes 104.

Figure 2:
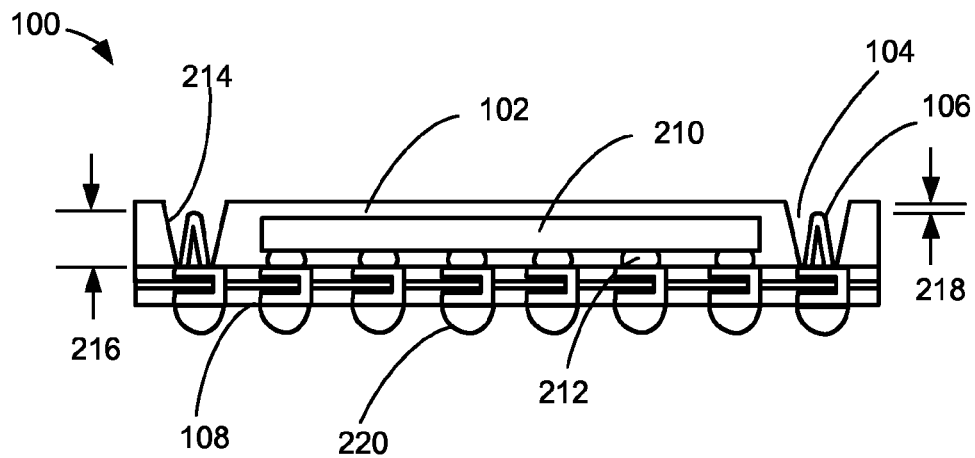
FIG. 2 is a cross-sectional view of the integrated circuit packaging system along a line 2-2 of FIG. 1.

Referring now to FIG. 2, therein is shown a cross-sectional view of the integrated circuit packaging system 100 along a line 2-2 of FIG. 1. The integrated circuit package system 100 can include the package carrier 108. An integrated circuit 210 is mounted to and over the package carrier 108. The integrated circuit 210 is defined as an active device having active circuitry fabricated thereon. Examples for the integrated circuit 210 can include an integrated circuit die, a packaged integrated circuit, a wafer chip scale package, or a flip chip.

The integrated circuit 210 can include electrical connectors 212. The electrical connectors 212 are defined as connection structures to electrically and mechanically connect and attach the integrated circuit 210 to the next system level. Examples of the electrical connectors 212 include solder bumps, conductive paste, or conductive posts.

The external wire 106 is attached to the package carrier 108. The external wire 106 can be formed in a loop configuration with both ends of the wire loop attached to the package carrier 108. The external wire 106 can be along a peripheral region of the package carrier 108.

The encapsulation 102 can be formed over the package carrier 108 covering the integrated circuit 210. The encapsulation 102 can also fill the space between the integrated circuit 210 and the package carrier 108 as well as the space between the electrical connectors 212.

The encapsulation 102 can include the holes 104 along the peripheral region of the package carrier 108. The encapsulation 102 can include sidewall 214 forming the non-horizontal bounds for each of the holes 104.

Each of the holes 104 can expose a portion of the package carrier 108 and the external wire 106. As an example, the external wire 106 includes a wire height 216 measured from the top of the package carrier 108 to the highest point of the wire loop of the external wire 106. The wire height 216 is below a top side 218 of the encapsulation 102.

External interconnects 220 can attach to the bottom of the package carrier 108 or at a side of the package carrier 108 opposite the side of the integrated circuit 210. The external interconnects 220 are defined as electrical connection structures providing electrical connection to the next system level (not shown).

It has been discovered that the present invention provides the integrated circuit packaging system 100 with reliable and low cost stacking and testing structures. The external wire 106 utilizes low cost and highly reliable manufacturing process to form robust and reliable electrical connect structure for stacking and testing of the integrated circuit packaging system 100.

Figure 3:
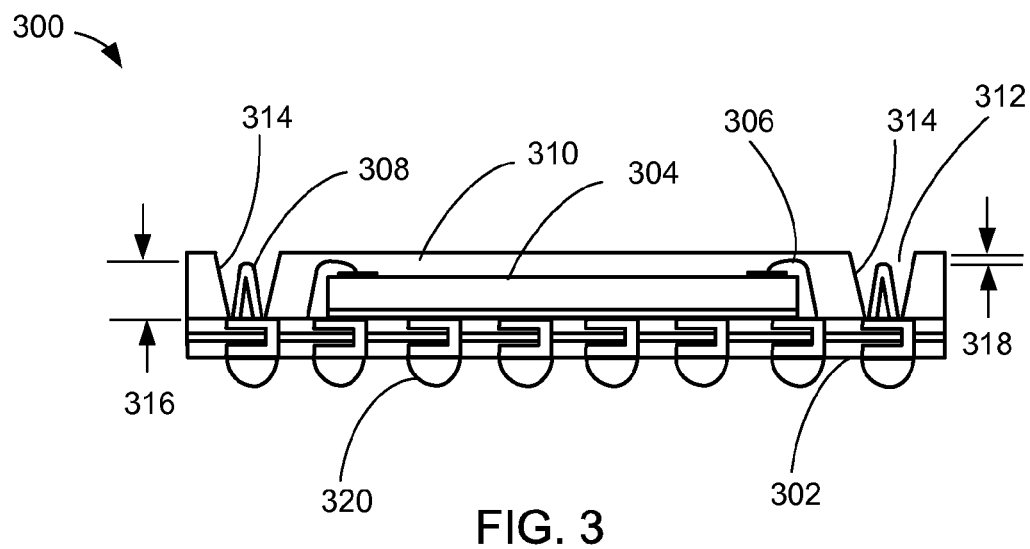
FIG. 3 is a cross-sectional view of an integrated circuit packaging system along a line 2-2 of FIG. 1 exemplified by the top view in FIG. 1 in a second embodiment of the present invention.

Referring now to FIG. 3, therein is shown a cross-sectional view of an integrated circuit packaging system 300 along a line 2-2 of FIG. 1 and exemplified by the top view in FIG. 1 in a second embodiment of the present invention. The integrated circuit package system 300 can include the package carrier 302. An integrated circuit 304 is mounted to and over the package carrier 302. The integrated circuit 304 is defined as an active device having active circuitry fabricated thereon.

Examples for the integrated circuit 304 can include an integrated circuit die, a packaged integrated circuit, a wafer chip scale package, or a flip chip.

The integrated circuit 304 can include electrical connectors 306. The electrical connectors 306 are defined as connection structures to electrically connect the integrated circuit 304 to the package carrier 302. Examples of the electrical connectors 306 include solder bumps, conductive paste, conductive posts, or bond wire directly connecting the integrated circuit 304 to the package carrier 302. The bonding wire is defined as an electrical connection structure made from a wire or a wiring technology and for the purpose of providing electrical connection between the integrated circuit 304 and package carrier 302.

An external wire 308 is attached to the package carrier 302. The external wire 308 can be formed in a loop configuration with both ends of the wire loop attached to the package carrier 302. The external wire 308 can be along a peripheral region of the package carrier 302.

The encapsulation 310 can be formed over the package carrier 302 covering the integrated circuit 304. The encapsulation 310 can also fill the space between the integrated circuit 304 and the package carrier 302 as well as the space between the electrical connectors 306.

The encapsulation 310 can include the holes 312 along the peripheral region of the package carrier 302. The encapsulation 310 can include sidewall 314 forming the non-horizontal bounds for each of the holes 312.

Each of the holes 312 can expose a portion of the package carrier 302 and the external wire 308. As an example, the external wire 308 includes a wire height 316 measured from the top of the package carrier 302 to the highest point of the wire loop of the external wire 308. The wire height 316 is below a top side 318 of the encapsulation 310.

External interconnects 320 can attach to the bottom of the package carrier 302 or at a side of the package carrier 302 opposite the side of the integrated circuit 304. The external interconnects 320 are defined as electrical connection structures providing electrical connection to the next system level (not shown).

It has been discovered that the present invention provides the integrated circuit packaging system 300 with reliable and low cost stacking and testing structures. The external wire 308 utilizes low cost and highly reliable manufacturing process to form robust and reliable electrical connect structure for stacking and testing of the integrated circuit packaging system 300.

Figure 4:
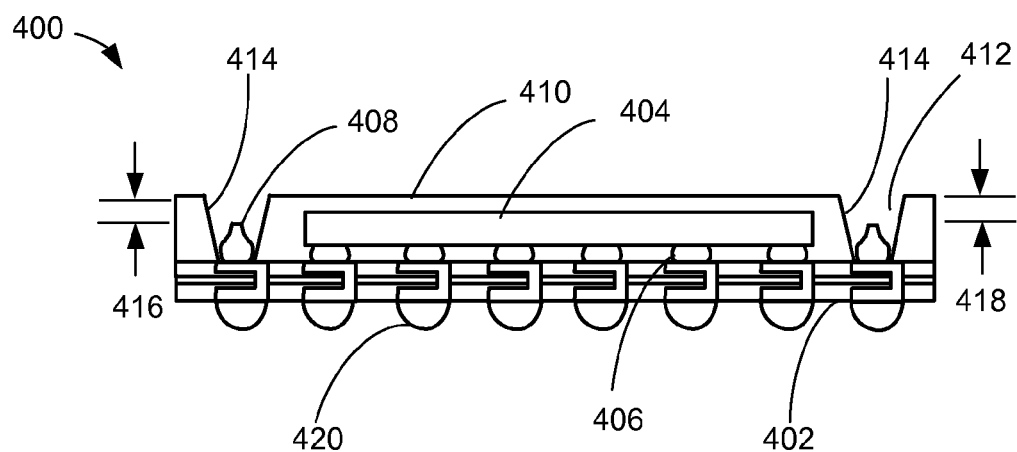
FIG. 4 is a cross-sectional view of an integrated circuit packaging system along a line 2-2 of FIG. 1 exemplified by the top view in FIG. 1 in a third embodiment of the present invention.

Referring now to FIG. 4, therein is shown a cross-sectional view the integrated circuit packaging system 400 along a line 2-2 of FIG. 1 exemplified by the top view in FIG. 1 in a third embodiment of the present invention. The integrated circuit package system 400 can include the package carrier 402. An integrated circuit 404 is mounted to and over the package carrier 402. The integrated circuit 404 is defined as an active device having active circuitry fabricated thereon. Examples for the integrated circuit 404 can include an integrated circuit die, a packaged integrated circuit, a wafer chip scale package, or a flip chip.

The integrated circuit 404 can include electrical connectors 406. The electrical connectors 406 are defined as connection structures to electrically and mechanically connect and attach the integrated circuit 404 to the next system level. Examples of the electrical connectors 406 include solder bumps, conductive paste, or conductive posts.

In this embodiment an external wire 408 is attached to the package carrier 402. The external wire 408 can be formed as a wire attached on the package carrier 402. The external wire 408 can then be cut leaving a protrusion above the package carrier 402 having a lower portion and a tip portion attached. As an example, the lower portion is attached to the package carrier 402 and wider than the tip portion, having the tip portion below the horizontal top surface of the encapsulation 410. The external wire 408 can be along a peripheral region of the package carrier 402.

The encapsulation 410 can be formed over the package carrier 402 covering the integrated circuit 404. The encapsulation 410 can also fill the space between the integrated circuit 404 and the package carrier 402 as well as the space between the electrical connectors 406.

The encapsulation 410 can include the holes 412 along the peripheral region of the package carrier 402. The encapsulation 410 can include sidewall 414 forming the non-horizontal bounds for each of the holes 412.

Each of the holes 412 can expose a portion of the package carrier 402 and the external wire 408. As an example, the external wire 408 includes a height 416 measured from the top of the package carrier 402 to the highest point of the external wire 408. The height 416 is below a top side 418 of the encapsulation 410.

External interconnects 420 can attach to the bottom of the package carrier 402 or at a side of the package carrier 402 opposite the side of the integrated circuit 404. The external interconnects 420 are defined as electrical connection structures providing electrical connection to the next system level (not shown).

It has been discovered that the present invention provides the integrated circuit packaging system 400 with reliable and low cost stacking and testing structures. The external wire 408 utilizes low cost and highly reliable manufacturing process to form robust and reliable electrical connect structure for stacking and testing of the integrated circuit packaging system 400.

Figure 5:
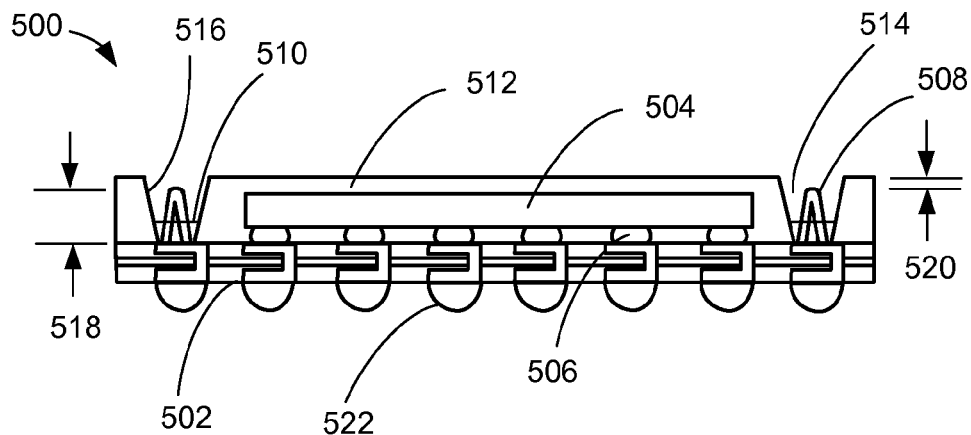
FIG. 5 is a cross-sectional view of an integrated circuit packaging system along a line 2-2 of FIG. 1 exemplified by the top view in FIG. 1 in a fourth embodiment of the present invention.

Referring now to FIG. 5, therein is shown a cross-sectional view of an integrated circuit packaging system 500 along a line 2-2 of FIG. 1 exemplified by the top view in FIG. 1 in a fourth embodiment of the present invention. The integrated circuit package system 500 can include the package carrier 502. An integrated circuit 504 is mounted to and over the package carrier 502. The integrated circuit 504 is defined as an active device having active circuitry fabricated thereon. Examples for the integrated circuit 504 can include an integrated circuit die, a packaged integrated circuit, a wafer chip scale package, or a flip chip.

The integrated circuit 504 can include electrical connectors 506. The electrical connectors 506 are defined as connection structures to electrically and mechanically connect and attach the integrated circuit 504 to the next system level. Examples of the electrical connectors 506 include solder bumps, conductive paste, or conductive posts.

An external wire 508 is attached to the package carrier 502. The external wire 508 can be formed in a loop configuration with both ends of the wire loop attached to the package carrier 502. The external wire 508 can be along a peripheral region of the package carrier 502.

The external wire 508 is attached to the package carrier 502. The external wire 508 can be formed in a loop configuration with both ends of the wire loop attached to the package carrier 502. The external wire 508 can be along a peripheral region of the package carrier 502.

The external wire 508 can be reinforced with a support conductor 510. The support conductor 510 provides for a further electrical and mechanical connection between the external wire 508 and the next system level. The support conductor 510 is defined as an electrical or chemical process that deposits silver, gold, copper or other non-ferrous metal, for example. The support conductor 510 uses the metal to adhere the external wire 508 to the package carrier 502 and the next system level.

The encapsulation 512 can be formed over the package carrier 502 covering the integrated circuit 504. The encapsulation 512 can also fill the space between the integrated circuit 504 and the package carrier 502 as well as the space between the electrical connectors 506.

The encapsulation 512 can include the holes 514 along the peripheral region of the package carrier 502. The encapsulation 512 can include sidewall 516 forming the non-horizontal bounds for each of the holes 514.

Each of the holes 514 can expose a portion of the package carrier 502 and the external wire 508. As an example, the external wire 508 includes a wire height 518 measured from the top of the package carrier 502 to the highest point of the wire loop of the external wire 508. The wire height 518 is below a top side 520 of the encapsulation 512.

External interconnects 522 can attach to the bottom of the package carrier 502 or at a side of the package carrier 502 opposite the side of the integrated circuit 504. The external interconnects 522 are defined as electrical connection structures providing electrical connection to the next system level (not shown).

It has been discovered that the present invention provides the integrated circuit packaging system 500 with reliable and low cost stacking and testing structures. The external wire 508 utilizes low cost and highly reliable manufacturing process to form robust and reliable electrical connect structure for stacking and testing of the integrated circuit packaging system 500.

Figure 6:
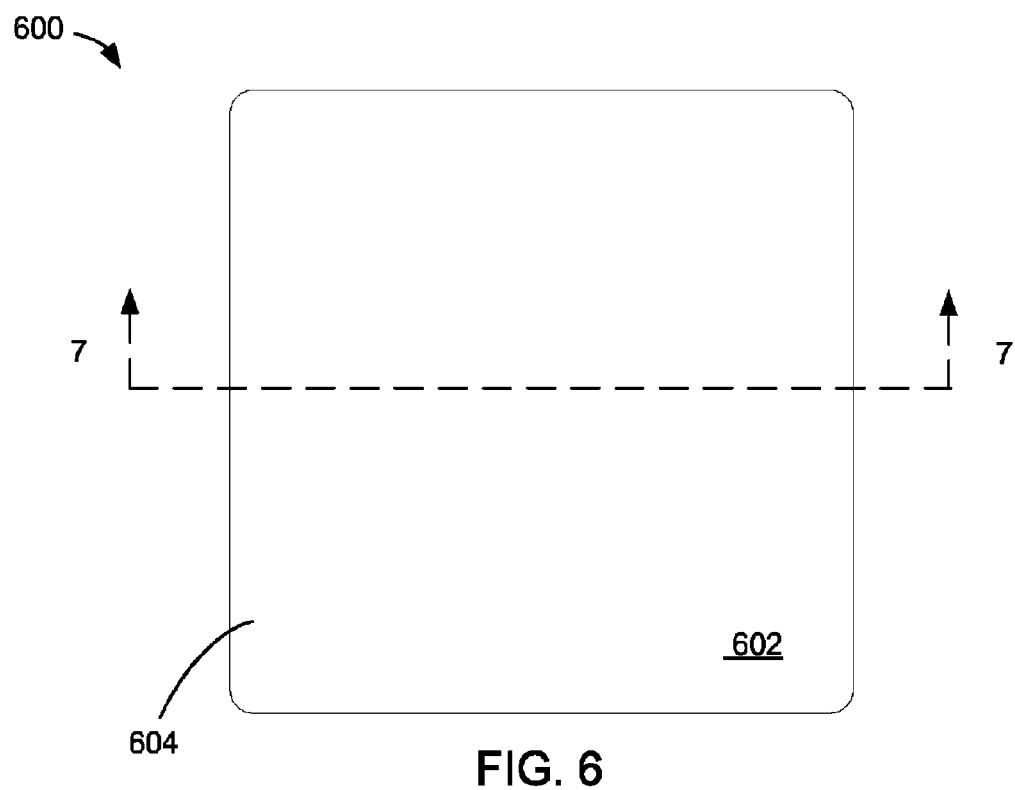
FIG. 6 is a top view of an integrated circuit packaging system exemplified in a fifth embodiment of the present invention.

Referring now to FIG. 6, therein is shown a top view of an integrated circuit packaging system 600 exemplified in a fifth embodiment of the present invention. The integrated circuit packaging system 600 can be an integrated circuit package-on-package system with a mounting integrated circuit packaging system 602 mounted on the integrated circuit packaging system 100 of FIG. 1. The second integrated packaging system 602 includes an encapsulation 604 defined as a cover to protect the contents within the integrated circuit packaging system 602 from the environment and provides a hermetic seal.

Figure 7:
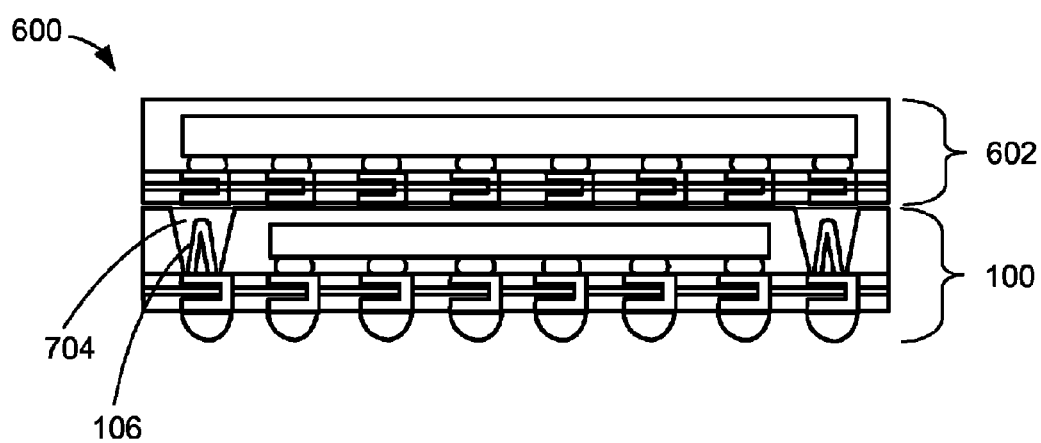
FIG. 7 is a cross-sectional view of the integrated circuit packaging system along line 7-7 of FIG. 6.

Referring now to FIG. 7, therein is shown a cross-sectional view of the integrated circuit packaging system 600 along line 7-7 of FIG. 6. This embodiment shows the integrated circuit packaging system 100 with the addition of the mounting integrated packaging system 602 mounted above.

The mounting integrated package system 602 can include interconnects that is formed to package interconnects 704 around the periphery that coincide with the locations of the external wire 106 of the integrated circuit packaging system 100. The mounting integrated package system 602 and the integrated circuit packaging system 100 can then be mechanically and electrically connected using a reflow process to connect the external wire 106 of the integrated packaging system 100 with the packaging system 602. The package interconnects 704 can fill the holes 104 encasing the external wire 106 and providing a reliable electrical connection and more surface area with the wire loop compared to surface area of a contact pad exposed from the substrate.

It has been discovered that the present invention provides an integrated circuit packaging system 600 having improved electrical performance. The external wire 106 formed in the configuration of a loop provides more surface area for electrical contact with the package interconnects 704 thereby improving electrical performance over simply contacting with the exposed portion of the package carrier 108.

Figure 8:
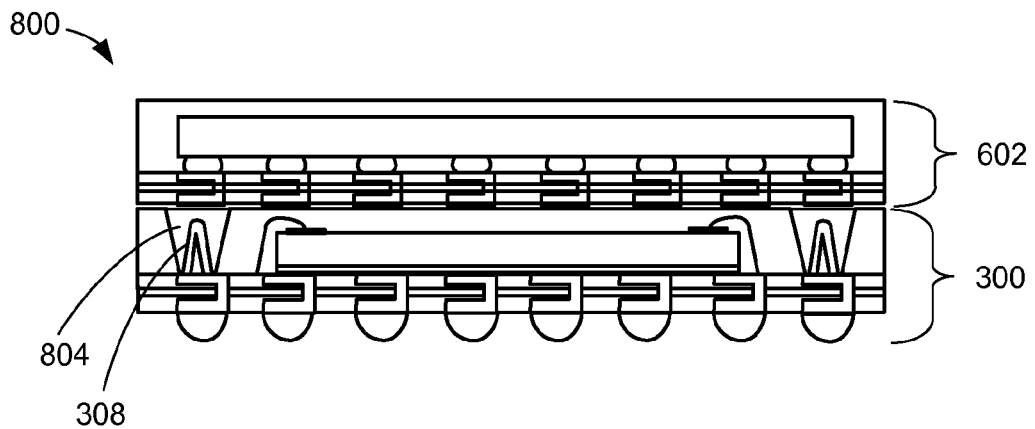
FIG. 8 is a cross-sectional view of an integrated circuit packaging system along a line 7-7 of FIG. 6 exemplified by the top view in FIG. 6 in a sixth embodiment of the present invention.

Referring now to FIG. 8, therein is shown a cross-sectional view of an integrated circuit packaging system along a line 7-7 of FIG. 6 exemplified by the top view in FIG. 6 in a sixth embodiment of the present invention. This embodiment shows the integrated circuit packaging system 300 with the addition of the mounting integrated packaging system 602 mounted above.

The mounting integrated package system 602 can include interconnects that forms package interconnects 804 around the periphery that coincide with the locations of the external wire 308 of the integrated circuit packaging system 300. The mounting integrated package system 602 and the integrated circuit packaging system 300 can then be mechanically and electrically connected using a reflow process to connect the external wire 308 of the integrated packaging system 300 with the interconnects of the packaging system 602. The package interconnects 804 can fill the holes 312 encasing the external wire 308 and providing a reliable electrical connection and more surface area with the wire loop compared to surface area of a contact pad exposed from the substrate.

It has been discovered that the present invention provides an integrated circuit packaging system 800 having improved electrical performance. The external wire 308 formed in the configuration of a loop provides more surface area for electrical contact with the package interconnects 804 thereby improving electrical performance over simply contacting with the exposed portion of the package carrier 302.

Figure 9:
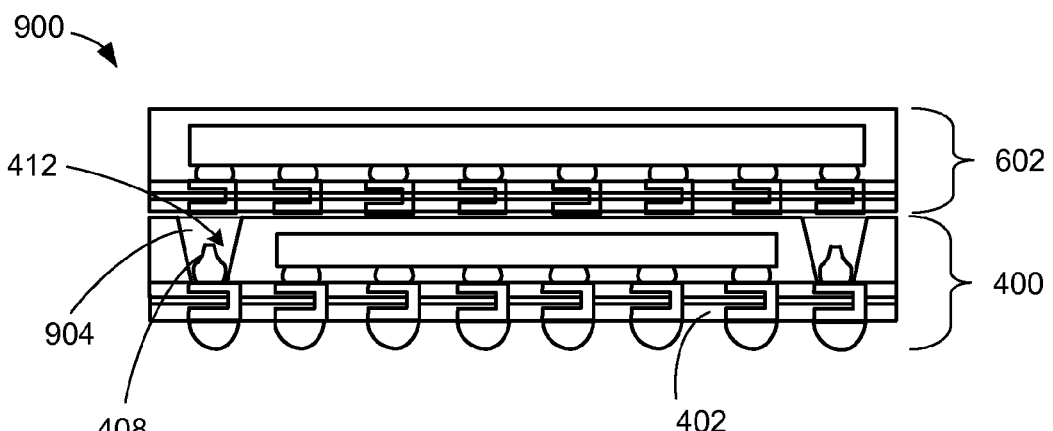
FIG. 9 is a cross-sectional view of an integrated circuit packaging system along a line 7-7 of FIG. 6 exemplified by the top view in FIG. 6 in a seventh embodiment of the present invention.

Referring now to FIG. 9, therein is shown a cross-sectional view of an integrated circuit packaging system along a line 7-7 of FIG. 6 exemplified by the top view in FIG. 6 in a seventh embodiment of the present invention. This embodiment shows the integrated circuit packaging system 400 with the addition of the mounting integrated packaging system 602 mounted above.

The mounting integrated package system 602 can include interconnects to form package interconnects 904 around the periphery that coincide with the locations of the external wire 408 of the integrated circuit packaging system 400. The mounting integrated package system 602 and the integrated circuit packaging system 400 can then be mechanically and electrically connected using a reflow process to connect the external wire 408 of the integrated packaging system 400 with the interconnects of the packaging system 602.

The package interconnects 904 can fill the holes 412 encasing the external wire 408 and providing a reliable electrical connection and more surface area with the wire loop compared to surface area of a contact pad exposed from the substrate.

It has been discovered that the present invention provides the integrated circuit packaging system 900 having improved electrical performance. The external wire 408 formed in the configuration of a loop provides more surface area for electrical contact with the package interconnects 904 thereby improving electrical performance over simply contacting with the exposed portion of the package carrier 402.

It has been also discovered that the present invention provides the integrated circuit packaging system 900 with improved reliability with more robust mechanical attachment. The external wire 408 formed in the configuration of a stud bump allows for additional surface to form intermetallic compound interface between the external wire 408 and the package interconnects 904 compared to just contact pads from the package carrier 402. The intermetallic compounds interface functions to provide the rigidity of the physical mechanical interface between the external wire 408 and the package interconnects 904. The additional surface area for the intermetallic compound creates a robust and more reliable physical attachment.

Figure 10:
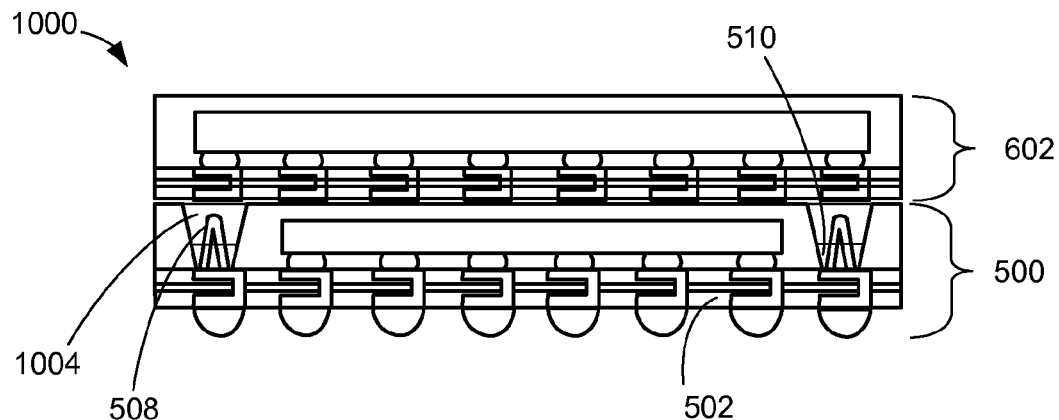
FIG. 10 is a cross-sectional view of an integrated circuit packaging system along a line 7-7 of FIG. 6 exemplified by the top view in FIG. 6 in an eighth embodiment of the present invention.

Referring now to FIG. 10, therein is shown a cross-sectional view of an integrated circuit packaging system along a line 7-7 of FIG. 6 exemplified by the top view in FIG. 6 in an eighth embodiment of the present invention. This embodiment shows the integrated circuit packaging system 500 with the addition of the mounting integrated packaging system 602 mounted above.

The mounting integrated package system 602 can interconnects to form package interconnects 1004 around the periphery that coincide with the locations of the external wire 508 of the integrated circuit packaging system 500. The mounting integrated package system 602 and the integrated circuit packaging system 500 can then be mechanically and electrically connected using a reflow process to connect the external wire 508 of the integrated packaging system 500 with the interconnects of the packaging system 602.

The package interconnects 1004 can fill the holes 514 encasing the external wire 508 and providing a reliable electrical connection and more surface area with the wire loop compared to surface area of a contact pad exposed from the substrate. The support conductor 510 can also provide additional surface area for reliable electrical connection.

It has been discovered that the present invention provides the integrated circuit packaging system 1000 having improved electrical performance. The external wire 508 formed in the configuration of a loop provides more surface area for electrical contact with the package interconnects 1004 thereby improving electrical performance over simply contacting with the exposed portion of the package carrier 502.

It has been also discovered that the present invention provides the integrated circuit packaging system 1000 having robust and reliable mechanical connection. The support conductor 510 can help anchor the external wire 508 to resist vertical pull thereby providing improved pull test performance and increased reliability of the mechanical attachment. The support conductor 510 also allows for additional surface to form intermetallic compound interface with the package interconnects 1004 compared to just contact pads from the package carrier 502. The intermetallic compounds interface functions to provide the rigidity of the physical mechanical interface between the support conductor 510 and the package interconnects 904. The additional surface area for the intermetallic compound creates a robust and more reliable physical attachment.

Figure 11:
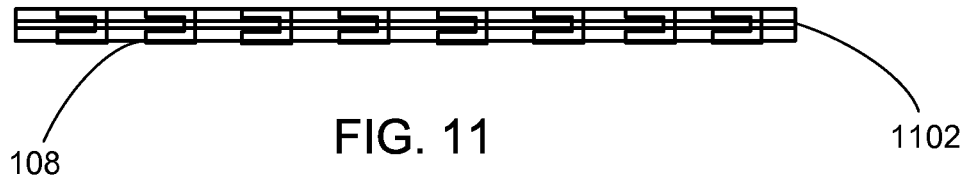
FIG. 11 is a cross sectional view of the integrated circuit packaging system in a manufacturing step with a carrier strip having the package carrier.

Referring now to FIG. 11, is a cross sectional view of the integrated circuit packaging system 100 in a manufacturing step with a carrier strip 1102 having the package carrier 108. The package carrier 108 is a support structure providing a mounting structure to the internal contents of the integrated circuit packaging system 100 as well as conductive paths within, to, and out of the integrated circuit packaging system 100. As examples, the package carrier 108 can be a laminated substrate, a ceramic substrate, or a leadframe type carrier.

Figure 12:
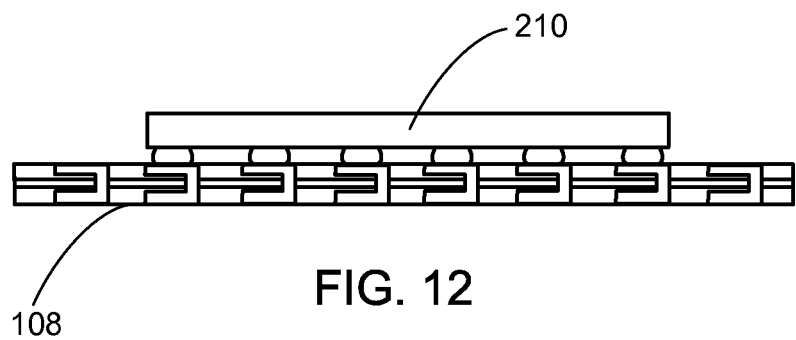
FIG. 12 is the structure of FIG. 11 in a mounting step for the integrated circuit attach.

Referring now to FIG. 12, is the structure of FIG. 11 in a mounting step for the integrated circuit 210 attach. The integrated circuit 210 is mounted to and over the package carrier 108. The integrated circuit 210 is an active device having active circuitry fabricated thereon. Examples for the integrated circuit 210 can include an integrated circuit die, a packaged integrated circuit, a wafer chip scale package, or a flip chip.

Figure 13:
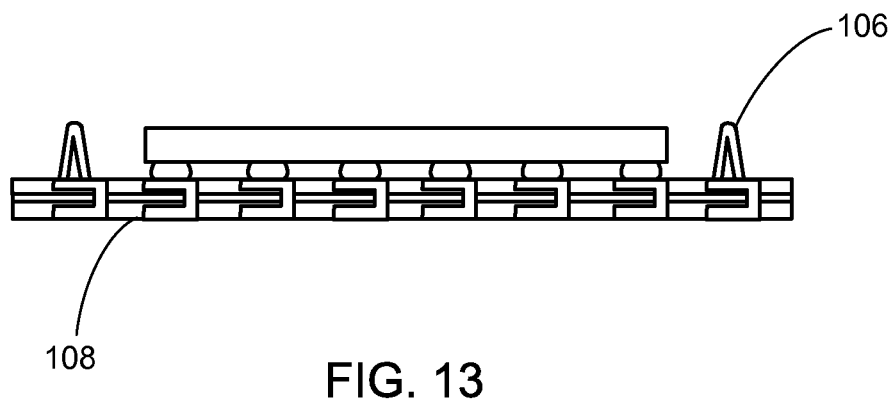
FIG. 13 is the structure of FIG. 12 in a mounting step for the external wire attach.

Referring now to FIG. 13, is the structure of FIG. 12 in a mounting step for the external wire 106 attach. The external wire 106 is attached to the package carrier 108. The external wire 106 can be formed in a loop configuration with both ends of the wire loop attached to the package carrier 108. The external wire 106 can be along a peripheral region of the package carrier 108.

Figure 14:
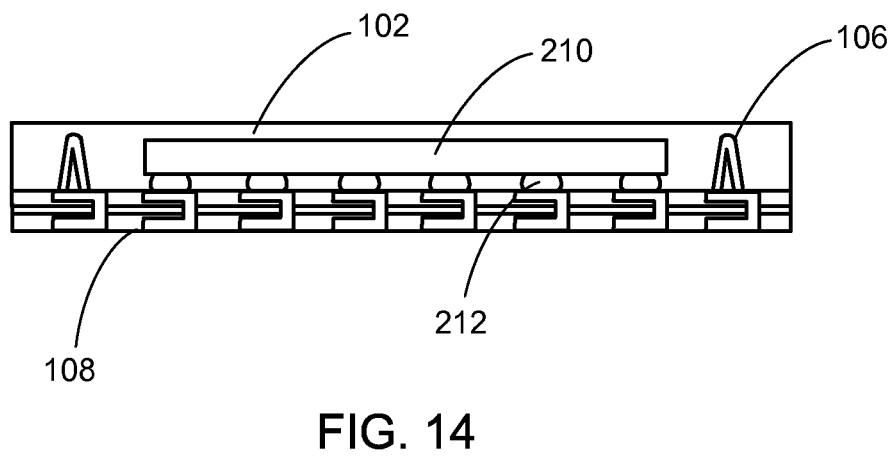
FIG. 14 is the structure of FIG. 13 in a process step for the encapsulation.

Referring now to FIG. 14, is the structure of FIG. 13 in a process step for the encapsulation 102. The encapsulation 102 can be formed over the package carrier 108 covering the integrated circuit 210. The encapsulation 102 can also fill the space between the integrated circuit 210 and the package carrier 108 as well as the space between the electrical connectors 212. The encapsulation 102 is defined as a cover to protect the contents within the integrated circuit packaging system 100 from the environment and provides a hermetic seal.

Figure 15:
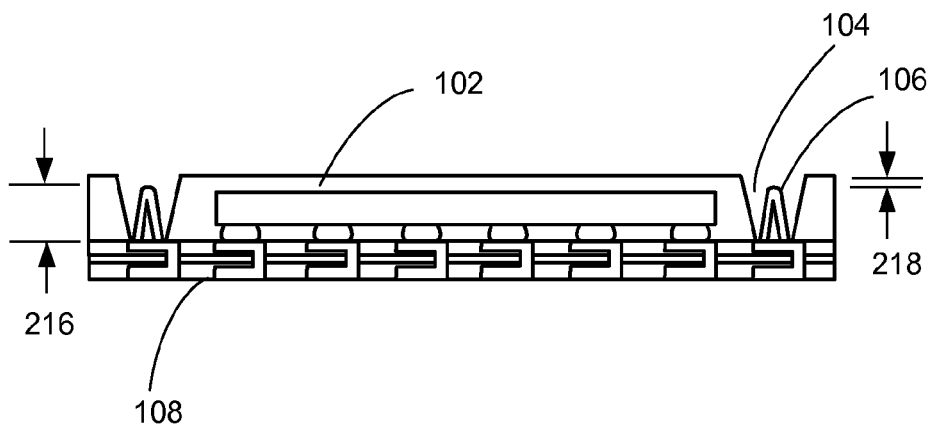
FIG. 15 is the structure of FIG. 14 in a process step for the hole formation.

Referring now to FIG. 15, is the structure of FIG. 14 in a process step for the hole 104 formation. The encapsulation 102 can include the holes 104 along the peripheral region of the package carrier 108. The encapsulation 102 can include sidewall 214 forming the non-horizontal bounds for each of the holes 104.

Each of the holes 104 can expose a portion of the package carrier 108 and the external wire 106. As an example, the external wire 106 includes a wire height 216 measured from the top of the package carrier 108 to the highest point of the wire loop of the external wire 106. The wire height 216 is below a top side 218 of the encapsulation 102.

Figure 16:
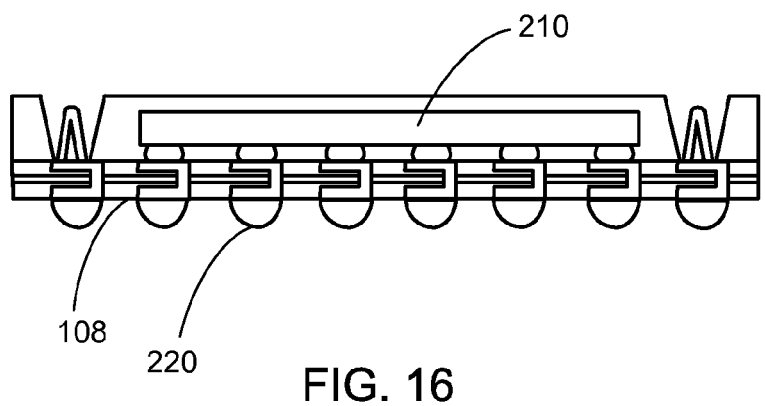
FIG. 16 is the structure of FIG. 15 in a process step for solder attach.

Referring now to FIG. 16, is the structure of FIG. 15 in a process step for solder 220 attach. External interconnects 220 can attach to the bottom of the package carrier 108 or at a side of the package carrier 108 opposite the side of the integrated circuit 210. The external interconnects 220 are defined as electrical connection structures providing electrical connection to the next system level (not shown).

Figure 17:
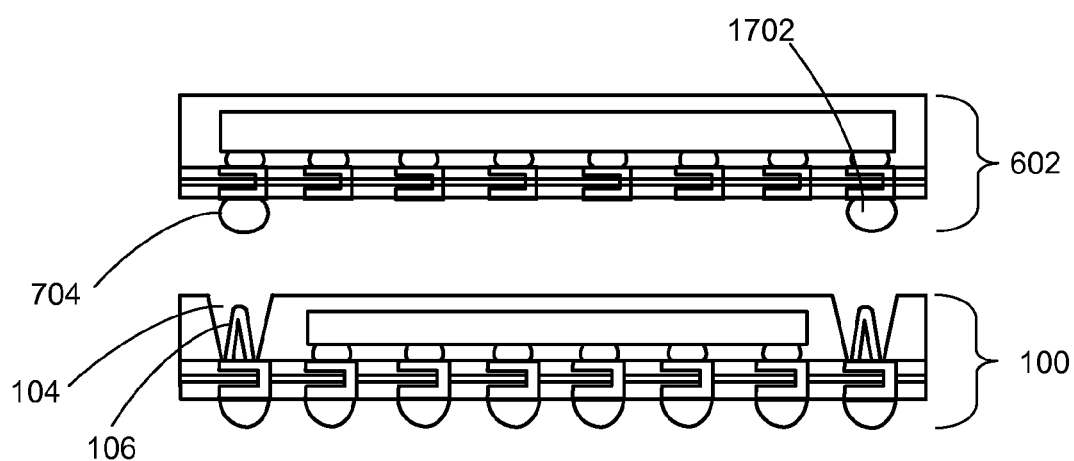
FIG. 17 is the structure of FIG. 16 in a mounting step for mounting the integrated circuit package attach.

Referring now to FIG. 17, is the structure of FIG. 16 in a mounting step for mounting integrated circuit package 602 attach. The mounting integrated package system 602 can include external interconnects 1702 around the periphery that coincide with the locations of the external wire 106 of the integrated circuit packaging system 100.

The mounting integrated package system 602 and the integrated circuit packaging system 100 can then be mechanically and electrically connected using a reflow process to connect the external wire 106 of the integrated packaging system 100 with the external interconnects 1702 of the packaging system 602 and forming the package interconnects 704. The package interconnects 704 can fill the holes 104 encasing the external wire 106 and providing a reliable electrical connection and more surface area with the wire loop compared to surface area of a contact pad exposed from the substrate.

Figure 18:
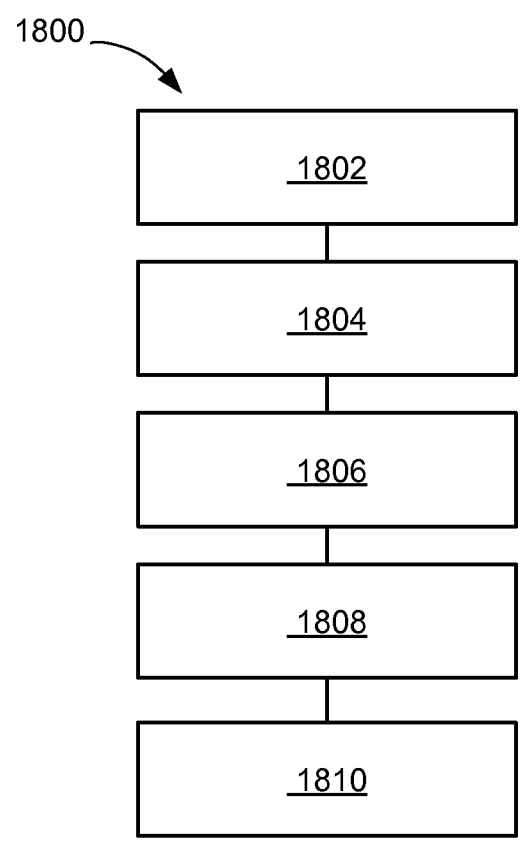
FIG. 18 is a flow chart of a method of manufacture of the integrated circuit packaging system in a further embodiment of the present invention.

Referring now to FIG. 18, therein is shown a flow chart of a method 1800 of manufacture of an integrated circuit packaging system 100 in an embodiment of the present invention. The method 1800 includes: providing a package carrier 108 in a block 1802; mounting an integrated circuit 210 to the package carrier 108 in a block 1804; forming an external wire 106 on the package carrier 108 and adjacent to the integrated circuit 210 in a block 1806; forming an encapsulation 102 on the package carrier 108 over the external wire 106 in a block 1808; and forming a hole 104 in the encapsulation 102 with the external wire 106 and a portion of the package carrier 108 exposed from the encapsulation in a block 1810.

Thus, it has been discovered that the integrated circuit packaging system of the present invention furnishes important and heretofore unknown and unavailable solutions, capabilities, and functional aspects for wiring technology for external connections. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing the integrated circuit packaging systems/fully compatible with conventional manufacturing methods or processes and technologies.

These and other valuable aspects of the present invention consequently further the state of the technology to at least the next level. While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a package carrier;
   mounting an integrated circuit to the package carrier;
   forming an external wire on the package carrier and adjacent to the integrated circuit;
   forming an encapsulation on the package carrier over the external wire; and
   forming a hole in the encapsulation with the external wire and a portion of the package carrier exposed from the encapsulation.

2. The method as claimed in claim 1 wherein forming the external wire includes forming the external wire in a loop configuration with both ends of the external wire attached to the package carrier.

3. The method as claimed in claim 1 further comprising forming a support conductor on the package carrier, the support conductor surrounding a bottom portion of the external wire leaving a top portion of the external wire exposed.

4. The method as claimed in claim 1 wherein forming the external wire includes forming the external wire, having a lower portion and a tip portion, the lower portion attached to the package carrier and wider than the tip portion.

5. The method as claimed in claim 1 further comprising:
   mounting a mounting integrated packaging system over the encapsulation; and
   forming a package interconnect between the mounting integrated packaging system and the external wire.

6. A method of manufacture of an integrated circuit packaging system comprising:
   providing a package carrier;
   mounting an integrated circuit to the package carrier;
   forming an external wire on the package carrier and adjacent to the integrated circuit;
   forming an encapsulation on the package carrier over the external wire; and
   forming a hole in the encapsulation exposing a portion of the package carrier and exposing the external wire below the top horizontal surface of the encapsulation.

7. The method as claimed in claim 6 wherein forming the hole in the encapsulation includes forming non-horizontal side walls along the encapsulation.

8. The method as claimed in claim 6 further comprising:
   mounting a mounting integrated packaging system over the encapsulation; and
   forming a package interconnect between the mounting integrated packaging system and the external wire with the package interconnect surrounding the external wire.

9. The method as claimed in claim 6 further comprising:
   forming a support conductor on the package carrier, the support conductor surrounding a bottom portion of the external wire leaving a top portion of the external wire exposed;
   mounting a mounting integrated packaging system over the encapsulation; and
   forming a package interconnect between the mounting integrated packaging system and the external wire with the package interconnect surrounding top portion of the external wire and in direct contact with the support conductor.

10. The method as claimed in claim 6 further comprising:
    mounting a mounting integrated packaging system over the encapsulation; and
    forming a package interconnect between the mounting integrated packaging system and the external wire with the package interconnect in direct contact with the package carrier.

* * * * *